United States Patent [19]

Kadin et al.

[11] 4,156,205

[45] May 22, 1979

[54] BINARY FREQUENCY SYNTHESIZER

[75] Inventors: Joseph Kadin, Rockville, Md.; Arthur J. Grey, Roseland; Marvin L. Kiss, Nutley, both of N.J.

[73] Assignee: International Telephone & Telegraph Corporation, Nutley, N.J.

[21] Appl. No.: 737,417

[22] Filed: Jun. 17, 1968

[51] Int. Cl.$^2$ ............................................. H03B 3/04
[52] U.S. Cl. .......................................... 331/25; 331/179; 331/36 C
[58] Field of Search .................. 331/179, 1 A, 18, 19, 331/25, 34, 36

[56] References Cited

U.S. PATENT DOCUMENTS

| | | | |
|---|---|---|---|
| 2,956,239 | 10/1960 | Hugenholtz et al. | 331/19 X |
| 3,139,593 | 6/1964 | Kaminski et al. | 331/179 X |
| 3,155,919 | 11/1964 | Baxter et al. | 331/19 |
| 3,427,561 | 2/1969 | Hamer | 331/25 X |

Primary Examiner—Nelson Moskowitz
Attorney, Agent, or Firm—John T. O'Halloran; Alfred C. Hill

[57] ABSTRACT

A voltage controlled oscillator has coupled thereto N capacitors in different permutation under control of an N stage binary counter and a counter drive signal enabling the generation of signals having $2^N$ discrete frequencies. A phase locked loop is employed to stabilize each of the $2^N$ frequencies. This loop includes a mixer coupled to a harmonic generator and the output of the oscillator. The mixer output is applied to a crystal filter whose output is phase compared with a reference signal and the resultant output is employed to stabilize the oscillator.

7 Claims, 1 Drawing Figure

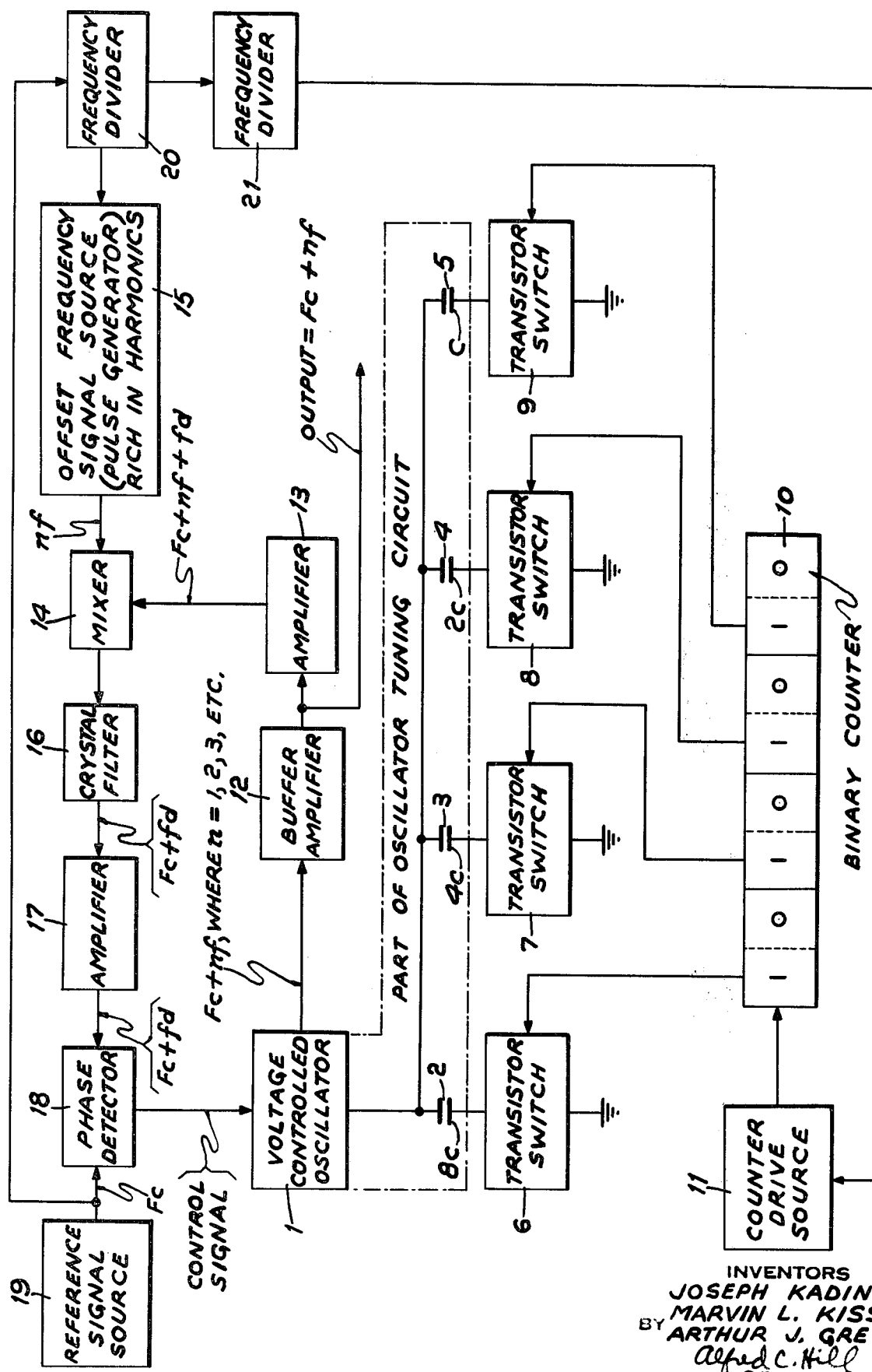

BINARY FREQUENCY SYNTHESIZER

BACKGROUND OF THE INVENTION

This invention relates to a frequency synthesizer and more particularly to a frequency synthesizer capable of producing a plurality of signals each having a different frequency.

A type of secure communication system employs a frequency "hopping" technique wherein the signal carrying the intelligence is hopped from one frequency to another in a random manner as far as an unauthorized receiver is concerned to maintain a secure communication system.

To provide signals having different frequencies to be employed with the above type communication system, it is necessary to provide a plurality of signals each having a different frequency and control thereof to randomly transmit these frequencies to an authorized receiver which will detect the various frequencies according to a predetermined program to recover the intelligence carried by the frequency hopping technique. One way of generating or synthesizing the signals having different discrete frequencies is to employ a plurality of oscillators, mixers associated therewith and sideband filters associated with the mixers to enable the selection of the signals having different frequencies. These signals would then be appropriately selected in a random manner to implement the frequency hopped communication system.

One of the problems with the foregoing type synthesizer is stability and phase coherence of the frequency signals produced.

SUMMARY OF THE INVENTION

An object of the present invention is to provide a frequency synthesizer whose signal outputs are easily stabilized and phase coherent.

Another object of the present invention is to provide a frequency synthesizer operating under control of a binary signal.

A feature of this invention is a binary frequency synthesizer comprising oscillator means; N tuning means, where N is an integer at least equal to one; and binary circuit means to couple the tuning means in different permutations to the oscillator means to generate signals having $2^N$ discrete frequencies.

Another feature of this invention is the provision of a phase locked loop coupled to the oscillator means of the above feature to stabilize each of the $2^N$ frequencies.

BRIEF DESCRIPTION OF THE DRAWING

The above-mentioned and other features and objects of this invention will become more apparent by reference to the following description taken in conjunction with the accompanying drawings, in which the sole FIGURE is a block diagram of one embodiment of the binary frequency synthesizer in accordance with the principles of the present invention.

DESCRIPTION OF THE PREFERRED EMBODIMENT

The binary frequency synthesizer in accordance with this invention includes voltage controlled oscillator 1 which produces a frequency output of $Fc+nf$, where n is equal to 1, 2, 3, etc. The frequency of the signal produced by oscillator 1 can be changed by coupling tuning means which form part of the oscillator tuning circuit, such as capacitors and inductors, either in series or parallel with the main tuning circuit of oscillator 1. As illustrated, capacitors 2, 3, 4 and 5 are capable of being coupled into the circuit of oscillator 1 by means of transistor switches 6, 7, 8 and 9 under control of binary counter or pseudo-noise code generator 10 driven by counter drive source 11. When used in pseudo-noise frequency hopped communication system frequency divider 21 and source 11 would be replaced by a pseudo-noise code generator and all the "1" pulses therefrom would serve as the drive for counter or code generator 10.

The output from the "1" output of the N stages of binary counter 10 controls the operation of transistor switches 6, 7, 8 and 9. Transistor switches are normally open to disconnect capacitors 2, 3, 4 and 5 from the tuning circuit of oscillator 1 and are closed in response to a binary "1" output of the associated stage of counter 10 to connect the desired one or ones of capacitors 2, 3, 4 and 5 to oscillator 1 to change the frequency of the oscillator output signal.

In the arrangement illustrated, N is equal to four thereby permitting binary counter 10 to couple capacitors 2, 3, 4 and 5 in different permutations to oscillator 1 to provide sixteen ($2^4$) signals having different output frequencies wherein one permutation of condensers 2, 3, 4 and 5 is obtained when all the capacitors are not coupled to the tuning circuit of oscillator 1. The frequency of the sixteen signals is expressed by the relation $Fc+nf$, where n=the fundamental (n=1) and harmonics of an offset frequency f. The values of capacitors 2, 3, 4 and 5 should be selected to be binary weighted as illustrated and provide integer harmonics of f when these capacitors are coupled in different permutations to the tuning circuit of oscillator 1 by counter 10. The illustrated connections between counter 10 and switches 6, 7, 8 and 9 is only one possible arrangement. There are many different connections possible depending on the desired frequency hopping sequence and the selected values of capacitors 2, 3, 4 and 5.

The output signal of oscillator 1, whose frequency is determined by the number of capacitors coupled thereto, is coupled to buffer amplifier 12 whose output signal provides the synthesizer output signal having a frequency $Fc+nf$ after being stabilized by the phase locked loop to now be described.

The output signal from amplifier 12 having a frequency $Fc+nf+fd$, where fd equals the frequency drift of the output signal, is coupled through amplifier 13 to mixer 14. The other input signal to mixer 14 is a signal having the offset frequency f and n harmonics thereof from source 15. The signal from source 15 is a pulse train rich in harmonics. The action of mixer 14 in cooperation with source 15 is to cancel the signal component having a frequency nf. The output of mixer 14 is coupled to crystal filter 16 to remove all but the signal having the wanted frequency $Fc+fd$. The output from filter 16 is coupled to amplifier 17 and, hence, to phase detector 18 who has its other input coupled to reference signal source 19 which generates a signal having a stable frequency Fc. The action of phase detector 18 is to produce a control voltage proportional to fd which is applied to oscillator 1 for frequency control thereof to stabilize all sixteen ($2^N$) frequencies of the output signal from the synthesizer. In other words, the control voltage from detector 19 eliminates the frequency drift fd of the output signal of the synthesizer system.

As will be apparent, the circuitry of this invention above described is easily frequency stabilized and the generated signals are phase coherent since there is only one oscillator in the circuit which is frequency controlled by a phase locked loop and the frequency signals of source 11 and 15 are both controlled from reference signal source 19 through frequency dividers 20 and 21.

While we have described above the principles of our invention in connection with specific apparatus, it is to be clearly understood that this description is made only by way of example and not as a limitation to the scope of our invention as set forth in the objects thereof and in the accompanying claims.

We claim:
1. A binary frequency synthesizer comprising:
   oscillator means;
   N tuning means, where N is an integer at least equal to one; and Binary circuit means to couple said tuning means in different permutations to said oscillator means to generate signals having $2^N$ discrete frequencies;
   said circuit means including
      switch means coupled to each of said tuning means,
      a binary counter having N stages, each stage being coupled to a different one of said switch means, and
      a source of drive signal coupled to said counter to control the counting thereof.
2. A synthesizer according to claim 1, wherein said tuning means each include
   a capacitor.
3. A synthesizer according to claim 1, further including
   a phase locked loop means coupled to said oscillator means to stabilize each of said $2^N$ frequencies.
4. A synthesizer according to claim 3, wherein said phase locked loop means includes
   a reference signal source,
   a harmonic generator to produce harmonic signals each having a frequency related to a portion of a different one of said $2^N$ frequencies,
   a mixer coupled to said generator and said oscillator means,
   a crystal filter coupled to said mixer, and
   a phase detector coupled to said filter, said reference signal source and said oscillator means to control said oscillator means to stabilize each of said $2^N$ frequencies.
5. A synthesizer according to claim 3, wherein said oscillator means includes
   a voltage controlled oscillator.
6. A synthesizer according to claim 3, wherein said tuning means each include
   a capacitor.
7. A binary frequency synthesizer comprising:
   oscillator means;
   N tuning means, where N is an integer at least equal to one;
   binary circuit means to couple said tuning means in different permutations to said oscillator means to generate signals having $2^N$ discrete frequencies; and
   a phase locked loop means coupled to said oscillator means to stabilize each of said $2^N$ frequencies;
   said tuning means each including
      a capacitor;
   said oscillator means including
      a voltage controlled oscillator;
   said circuit means including
      a transistor switch coupled to each of said capacitors,
      a binary counter having N stages, each stage being coupled to a different one of said switching means, and
      a source of drive signal coupled to said counter to control the counting thereof; and said phase locked loop means including
      a reference signal source,
      a harmonic generator to produce harmonic signals each having a frequency related to a portion of a different one of said $2^N$ frequencies,
      a mixer coupled to said generator and said oscillator,
      a crystal filter coupled to said mixer, and
      a phase detector coupled to said filter, said reference signal source and said oscillator to control said oscillator to stabilize each of said $2^N$ frequencies.

* * * * *